US006466596B1

(12) United States Patent
Dyott

(10) Patent No.: US 6,466,596 B1
(45) Date of Patent: Oct. 15, 2002

(54) BROADENING THE LINEWIDTH OF A SEMICONDUCTOR LASER

(75) Inventor: Richard B. Dyott, Oak Lawn, IL (US)

(73) Assignee: KVH Industries, Inc., Tinley Park, IL (US)

( * ) Notice: Subject to any disclaimer, the term of this patent is extended or adjusted under 35 U.S.C. 154(b) by 0 days.

(21) Appl. No.: 09/568,371

(22) Filed: May 10, 2000

Related U.S. Application Data
(60) Provisional application No. 60/133,357, filed on May 10, 1999.

(51) Int. Cl.[7] .................................................. H01S 3/10
(52) U.S. Cl. ..................................................... 372/38.02
(58) Field of Search ............................... 372/38.02, 20, 372/25

(56) References Cited

U.S. PATENT DOCUMENTS

| | | | |
|---|---|---|---|
| 5,881,082 A | | 3/1999 | Yaabuchi ..................... 372/38 |
| 5,895,984 A | | 4/1999 | Renz ........................... 387/106 |
| 6,151,344 A | * | 11/2000 | Kiely et al. .................. 372/38 |
| 6,198,497 B1 | * | 3/2001 | Luque ......................... 347/247 |
| 6,229,832 B1 | * | 5/2001 | Baba et al. ............... 372/38.01 |

\* cited by examiner

Primary Examiner—James W. Davie
(74) Attorney, Agent, or Firm—Foley Hoag LLP

(57) ABSTRACT

The invention is directed to a system and a method for controllably broadening the spectral characteristics, such as the emission linewidth, of a semiconductor laser by discharging an electric pulse, for example, a charged transmission line, across the laser terminals. The linewidth-broadened lasers find application in fiber optic sensors, such as fiber optic gyroscopes and current sensors, which have a relatively short de-coherence length.

27 Claims, 6 Drawing Sheets

BROADENING THE LINEWIDTH OF A SEMICONDUCTOR LASER

CROSS-REFERENCE TO OTHER PATENT APPLICATIONS

This application claims the benefit of U.S. Provisional Patent Application No. 60/133,357, filed 05/10/1999, which is incorporated herein by reference.

FIELD OF THE INVENTION

This application relates to a system and method for providing light emission from a semiconductor laser and more particularly, for controllably broadening the linewidth of a semiconductor laser.

BACKGROUND OF THE INVENTION

Optical and opto-electronic devices frequently require light sources with specifically tailored optical properties. For example, an interferometer fiber optic gyroscope (FOG), which detects movement of an object, is an example of such an opto-electronic device. To avoid interference effects arising from multiple reflections in the optical circuit of a FOG, a suitable light source should have a linewidth great enough so that the de-coherence length of the fiber is shorter than the distance between discontinuities in the circuit. For example, in a FOG, the de-coherence length of the fiber should be shorter than the distance between a fiber splice and a directional coupler. The de-coherence length of an optical fiber is determined by the wavelength and the linewidth of the light propagating in the fiber.

Lasers are known to emit light in a narrow emission cone which can advantageously be coupled into fibers with a high coupling efficiency. However, the narrow spectral linewidth and associated large coherence length make laser sources unsuitable for fiber optic gyros. On the other hand, the linewidth below the lasing threshold, i.e., in the spontaneous emission regime, is broad, but not much usable power is generated.

Fiber optic gyros can be operated using a superluminescent diode as a light source. Superluminescent diodes have a light-guiding structure in the form of an optical waveguide and emit light more directionally than LEDs made in the form of a simple p-n junction structure. Superluminescent diodes, however, have become very expensive—as compared to, for example, lasers used in CD disk players—due to low commercial demand, thereby increasing the overall cost of fiber optic gyros. It is therefore desirable to provide a high-power and low-cost light source which has the advantageous properties of a superluminescent diode.

SUMMARY OF THE INVENTION

According to one aspect of the invention, a method and a system are disclosed for controllably broadening the spectral characteristics of a semiconductor laser to produce a superluminescent diode. The method includes charging a transmission line with a predetermined charge, connecting one end of the transmission line to electrical terminals of the semiconductor laser, with the other end of the transmission line forming a reflective circuit, possibly repeatedly discharging the transmission line through the semiconductor laser, and monitoring the spectral characteristics of radiation emitted at a laser facet at a predetermined laser current until the spectral characteristics of the emitted radiation match predetermined spectral characteristics.

According to another aspect of the invention, a method is disclosed for producing a semiconductor light source suitable for use in a fiber-optic sensor having a predetermined birefringence. The method includes providing a semiconductor laser initially having spectral characteristics which produce a de-coherence length greater than a predetermined spacing in the fiber-optic sensor, charging a transmission line with a predetermined charge, connecting one end of the transmission line to electrical terminals of the semiconductor laser, with the other end of the transmission line forming a reflective circuit, possibly repeatedly discharging the transmission line through the semiconductor laser, and monitoring the spectral characteristics of radiation emitted at a laser facet at a predetermined laser current, until the spectral characteristics of the semiconductor laser produce a de-coherence length which is smaller than the predetermined spacing in the fiber-optic sensor.

Embodiments of the invention may include one or more of the following features. The spectral characteristics may be the full-width-at-half-maximum (FWHM) of an emission spectrum of the laser measured at a predetermined laser current which causes lasing of the semiconductor laser before the transmission line is discharged through the semiconductor laser. The transmission line may be a coaxial cable. The predetermined charge may be provided by a power supply connected, possibly via a resistor, to the distal end of the transmission line, i.e., the end opposite to the end where the laser is connected. The resistor may have a sufficiently high resistance to cause a voltage pulse traveling along a longitudinal direction of the transmission line to be reflected at the distal end of the resistor. The length of the coaxial cable may be selected to discharge the coaxial cable through the semiconductor laser by a current pulse having a pulse duration between 10 and 1000 ns, preferably approximately 100 ns.

BRIEF DESCRIPTION OF DRAWINGS

The following figures depict certain illustrative embodiments of the invention in which like reference numerals refer to like elements or to elements performing similar functions. These depicted embodiments are to be understood as illustrative of the invention and not as limiting in any way.

DETAILED DESCRIPTION OF THE CERTAIN ILLUSTRATED EMBODIMENTS

By way of background information, a fiber optic gyro (FOG) typically is made of several meters of fiber wound in the form of a coil, with the ends of the coil terminated by splices. The splices represent imperfections in the optical path and can introduce reflections of the light. If the de-coherence length of the light propagating in the fiber is greater than the separation between the splices, then interference can occur which can degrade the performance of the FOG. The imperfection can be caused by other optical elements, such as a directional coupler, or by imperfections in the fiber itself. The de-coherence length $L_d$ is defined by $$L_d = \frac{L_s}{\Delta\beta + v * \frac{d(\Delta\beta)}{dv}}$$

where $\Delta\beta$ is the normalized birefringence of the fiber, v is the normalized frequency, and $L_s$ is the coherence length of the source. The latter is given by $$L_s = \frac{\lambda^2}{\Delta\lambda}$$

where $\Delta\lambda$ is the linewidth, and $\lambda$ is the free space wavelength of the source. As an example, a semiconductor diode may have a free-space wavelength of 815 nm and a linewidth of 0.2 nm, producing a source coherence length of 3.3 mm. An elliptical core fiber operated at its point of maximum birefringence, $\Delta\beta=3\times10^{-4}$, has a de-coherence length of approximately $L_d=11$ m. Accordingly, the de-coherence length is greater than the length of fiber of typical fiber optic gyros.

A conventional luminescent diode (LED), on the other hand, is a Lambertian source with a linewidth of several tens of nanometers, thus reducing the de-coherence length to much less than one meter. Superluminescent diodes have a waveguide structure and emit light in a preferred direction, which is advantageous for coupling into the fiber of a FOG. The linewidth of a superluminescent diode is in the order of 10 nm. Lasers have become an inexpensive commodity due to the proliferation of laser recording and playback devices, such as CD-ROMs and DVDs. The availability of superluminescent diodes, on the other hand, is limited, making them rather expensive. It would therefore be desirable to produce a superluminescent diode from a laser for applications in fiber optic sensors.

The spectral characteristics of a semiconductor laser, such as the full width at half maximum (FWHM), also referred to as linewidth can broadened, eventually suppressing the lasing action altogether, by controllably reducing the reflectivity of the laser facets. It is known that semiconductor laser diodes have to be handled carefully to avoid an electric discharge across the laser terminals which can easily damage the laser facets and possibly even destroy the p-n junction. Facet damage may be caused by the optical field at the facet which can cause local heating resulting in evaporation and/or ablation of the reflective facet coating.

Figure 1A:
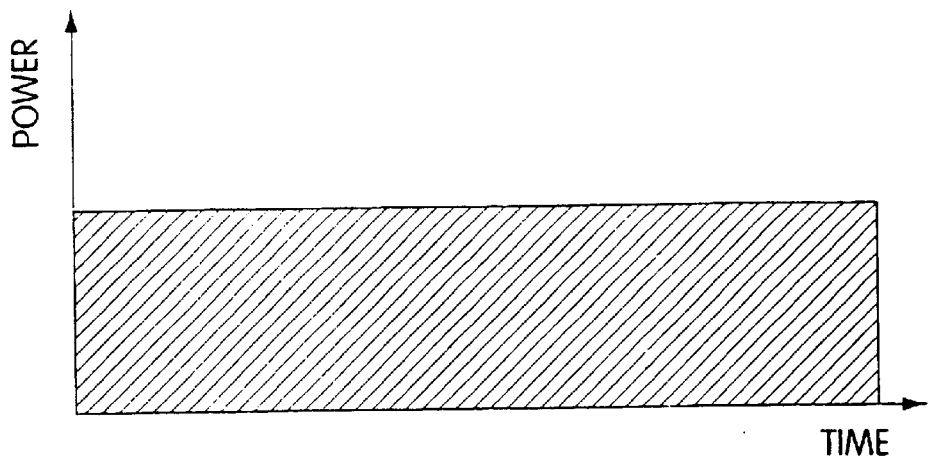
FIGS. 1A–C show schematically different curves of the emitted optical power versus time for an exemplary laser in continuous (FIG. 1A) as well as pulsed operation (FIGS. 1B and C) for carrying out the method of the invention.
Figure 1B:
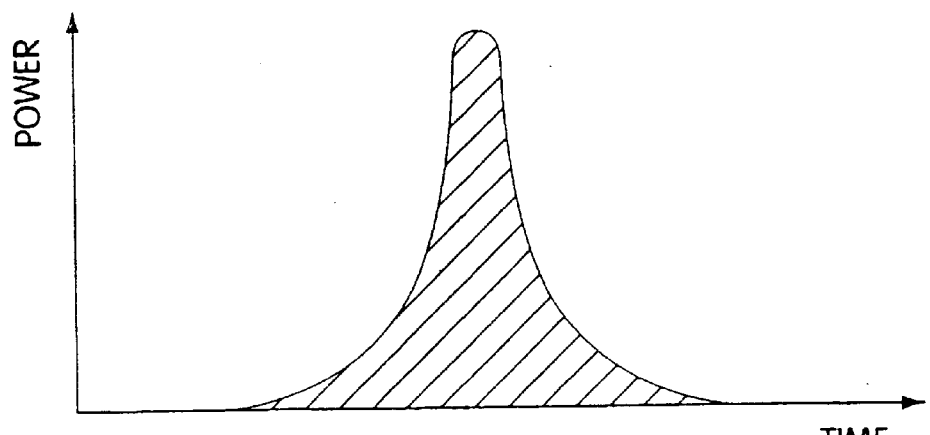
Figure 1C:
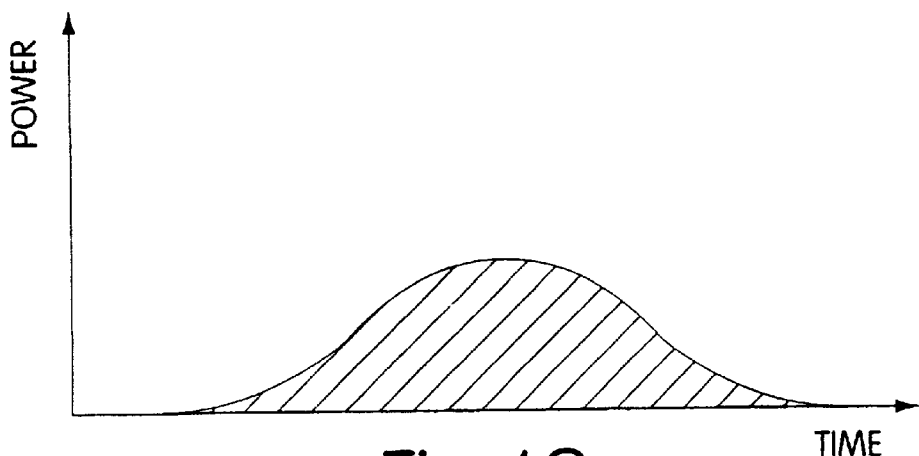

Referring first to FIGS. 1A–1C, curves of the emitted optical power versus time are shown for an exemplary laser which is operated in continuous mode (FIG. 1A) as well as pulsed mode (FIGS. 1B and 1C). During laser operation, a certain amount of optical power passes through the laser facet. When the laser operates in continuous mode (CW), as depicted in FIG. 1A, the supplied electric power is constant. When the laser operates in pulsed mode, the instantaneous optical power at any given point in time is a function of the temporal shape of the I-V characteristics, with the area under the current vs. time curve representing the electrical power supplied to the laser during one pulse. For a fixed supplied energy, the peak power will therefore depend on the temporal characteristics of the I-V curve. The light energy absorbed by the facet and/or the facet/laser interface will cause heating at that interface. The temperature reached by the facet will depend on the manner energy is delivered to the facet. For example, in CW operation, the facet will heat up and then reach a steady temperature determined by the thermal properties of the facet material, such as the heat capacity, the thermal conductivity, and the thermal diffusivity. If a large continuous power is applied to the laser (FIG. 1A), then both the facet and the laser itself will heat up, eventually destroying the laser itself. Interior temperatures in the order of several hundred ° C. can destroy a compound semiconductor laser structure. The facet coating, on the other hand, which is typically constructed of a dielectric stack, can withstand temperatures in excess of 1,000° C.

In pulsed operation, as depicted in FIGS. 1B and 1C, the temperature of the facet will rise quickly with increasing instantaneous power, whereas for short pulses the internal temperature of the laser, i.e., the temperature of the p-n junction and waveguide structure, will remain essentially unchanged. The exact temperature profile will depend on the temporal shape of the electric pulse delivered to the laser terminals, as well as on the thermal characteristics of the laser and facet structure and material, as described above. For example, as seen in FIG. 1B, an optical pulse having an energy defined by the area under the power-time curve may be extremely short and therefore have a very high peak power. This very high peak power may heat up the facet to a very high-temperature due to the small heat capacity of the facet, thereby causing complete evaporation or ablation of the facet material and potentially also damaging semiconductor material at the facet/semiconductor interface. The damaged semiconductor interface may introduce short currents which cause additional heating and the damage to the laser p-n junction itself. On the other hand, as depicted in FIG. 1C, the energy may be delivered to the laser over a longer period of time while still producing enough peak power to cause damage to and thereby reduce the reflectivity of the facet. In this case, the lasing action will deteriorate and strong superluminescent will evolve, as is intended for application in a FOG. Accordingly, a system and a method for controllably reducing the reflectivity of a laser facet to convert the laser diode into a superluminescent diode will now be described.

Figure 2A:
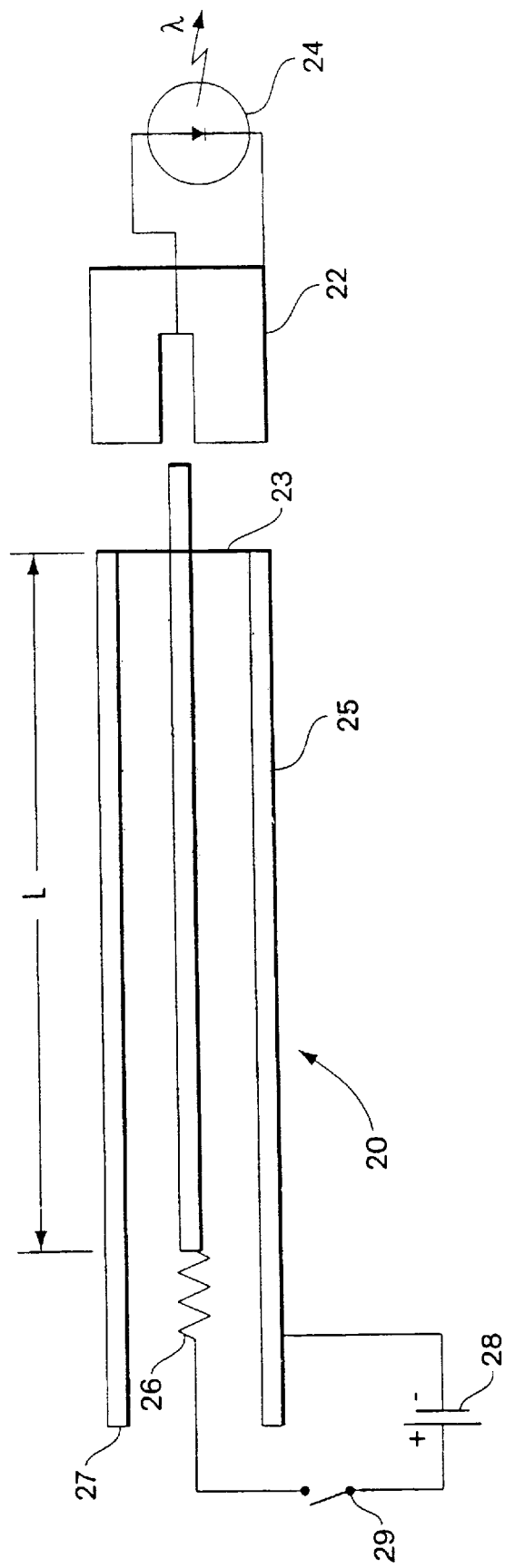
FIG. 2A shows a system with a transmission line for providing a pulse according to the method of the invention.

Referring now to FIG. 2A, a connector 22, for example, a BNC connector may be attached to a semiconductor laser diode 24. A coaxial cable 25 of length L forms a transmission line 20, wherein the capacitance of the transmission line 20 is determined by the characteristic properties and the length of the coaxial cable 25. An exemplary coaxial cable may have a capacitance of, for example, 100 pF per meter. The cable 25 is charged by, for example, a power supply or a battery 28 providing a voltage V. Advantageously, an optional resistor 26 with a relatively large resistance R of several MO is inserted between the power supply 28 and the center conductor of the coaxial cable 25 to limit the charging current and also to provide a mismatched termination on the end 27 of the cable 25 which reflects an electrical discharge pulse traveling in the cable 25, as discussed below. The end 27 of the coaxial cable 25 may extend over the resistor 26, forming a waveguide that is beyond cut-off so that no electromagnetic radiation is present beyond the end 27 that is terminated by the resistor 26. The resistor may be incorporated within the coaxial cable 25. The end 27 thereby effectively forms a reflective circuit which reflects electrical pulses propagating in the transmission line. The opposite end 23 of the coaxial cable may include a connector adapted to mate with a connector 22 to which the laser 24 is connected.

A capacitor with a capacitance C and charged with a voltage V stores an energy of $$C = \frac{1}{2} * C * V^2.$$

An exemplary cable having a capacitance of 100 pF/m, a length of 1 m and being charged with a voltage V=1,000 V stores an energy of E=50 μJ. When—after the cable 20 has been charged—the end 23 of the charging coaxial cable 25 is connected to the semiconductor laser diode 24, a voltage pulse travels along the coaxial cable 25 and is reflected at the reflective end 27, traveling back to the end 23 and covering a total distance 2L. The pulse duration is equal to the round-trip travel time of the pulse, and the voltage is half the applied voltage. The round-trip travel time can be expressed as:

$$t = \frac{2*L}{c} * \sqrt{\epsilon}$$

wherein c is the free space speed of light and $\epsilon$ is the dielectric constant of the dielectric material of the coaxial cable located between the inner conductor and the outer jacket. With a typical value of $\epsilon$=2.3 for a Teflon™-insulated coaxial cable, the round-trip travel time of a pulse is approximately 10 ns/m.

Figure 2B:
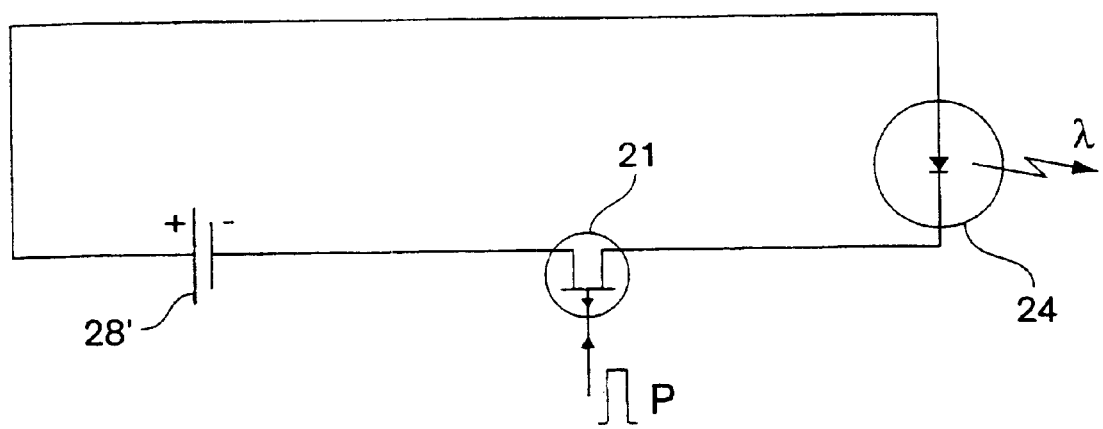
FIG. 2B shows a system with a switched power supply for providing a pulse according to the method of the invention.

FIG. 2B shows an alternate embodiment, wherein the electrical pulse of duration t is supplied by a switched power supply which can be implemented, for example, using a DC power supply 28' and an FET 21 which is controlled by a pulse P.

Figure 3A:
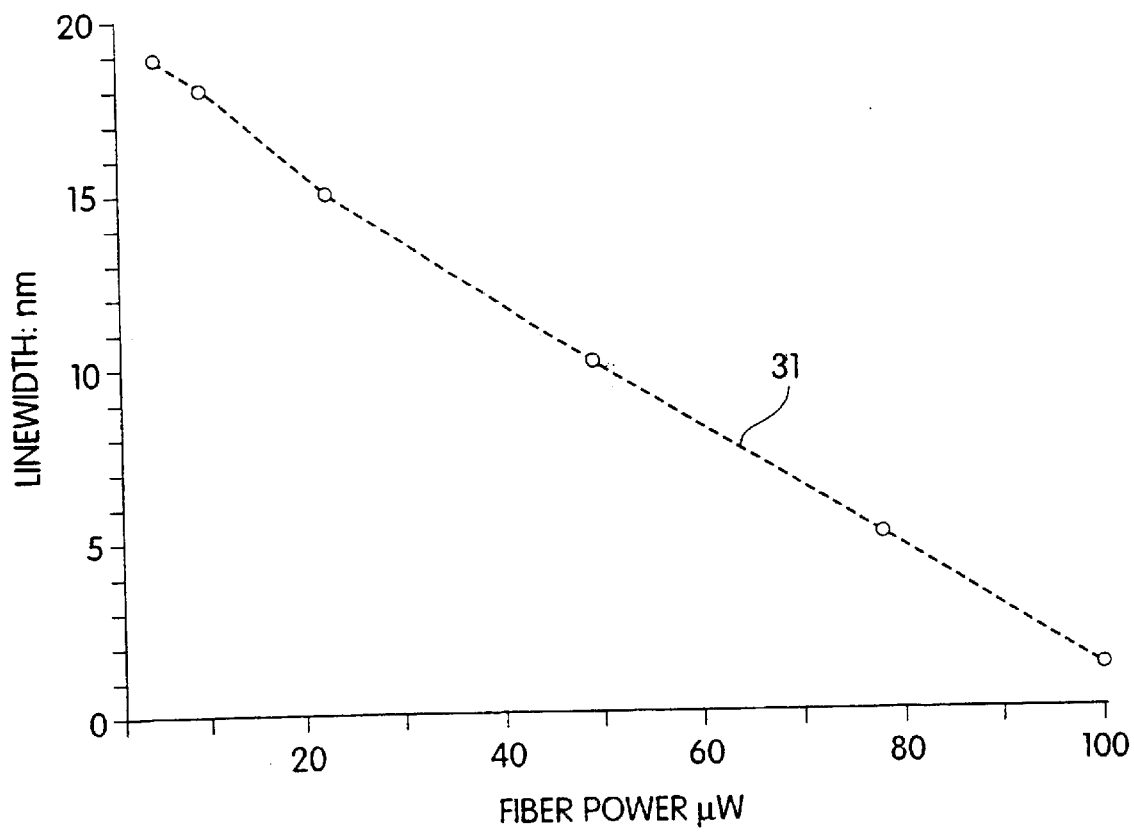
FIGS. 3A and B show the emission linewidth versus fiber-coupled optical power before (FIG. 3A) and after applying six sequential electrical discharge pulses (FIG. 3B) to an exemplary laser diode.
Figure 3B:
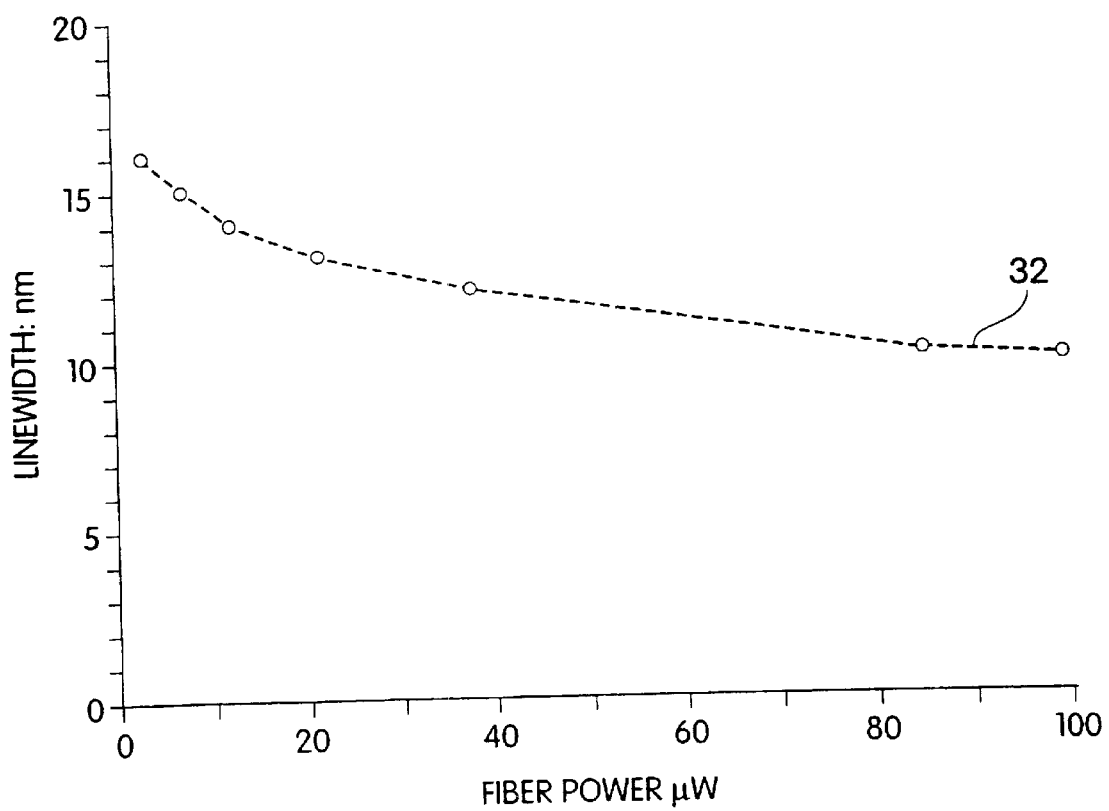

FIGS. 3A and 3B show the cumulative effect after applying six sequential electrical discharge pulses to an exemplary 5 mW laser diode Model RLD 78 PIT from Rohm. The linewidth of the semiconductor laser is plotted as a function of power coupled into the fiber. This laser has an index-guided laser structure and is used primarily for reading information from CD-ROM disks. The electrical discharge pulses were produced by charging a 10 m long coaxial cable RG 58C/U cable terminated on the charging end 27 by a 10 MΩ resistor 26 to a voltage of 60 V. The power supply 28 may be disconnected from the cable 25 by opening a switch 29 after the cable 25 has been charged. Alternatively, the cable 25 may stay connected with the power supply 28 since the current which would flow through the laser 24 is limited to at most several μA by the 10 MΩ resistor 26.

FIG. 3A shows a curve 31 of the initial linewidth of the laser as a function of the fiber-coupled power before the discharge pulses are applied to the laser. The linewidth decreases from approximately 20 nm (before the laser begins to emit stimulated laser emission) to approximately 1 nm at 100 μW fiber-coupled optical power (under lasing conditions). As mentioned above, a linewidth of 1 nm produces a de-coherence length of more than 20 meters, which is unacceptably large for most fiber optic sensor applications.

FIG. 3B shows a curve 32 of the FWHM linewidth of the laser as a function of the fiber-coupled power after the six sequential electrical discharge pulses are applied to the laser. The linewidth of the exemplary 5 mW laser is monitored at a DC laser current of 45 mA. It will be understood by those skilled in the art that the current at which the linewidth broadening is monitored, depends on the specific laser and its operating characteristics. For example, a 50 mW laser will require a higher operating current. As seen from FIG. 3B, the linewidth is—like in FIG. 3A—a decreasing function of the fiber-coupled optical power. However, the linewidth at a fiber-coupled optical power of 100 μW is approximately 10 nm, i.e., 10 times greater than the initial lasing linewidth at the same power. This increased linewidth reduces the de-coherence length by the same factor.

Figure 4:
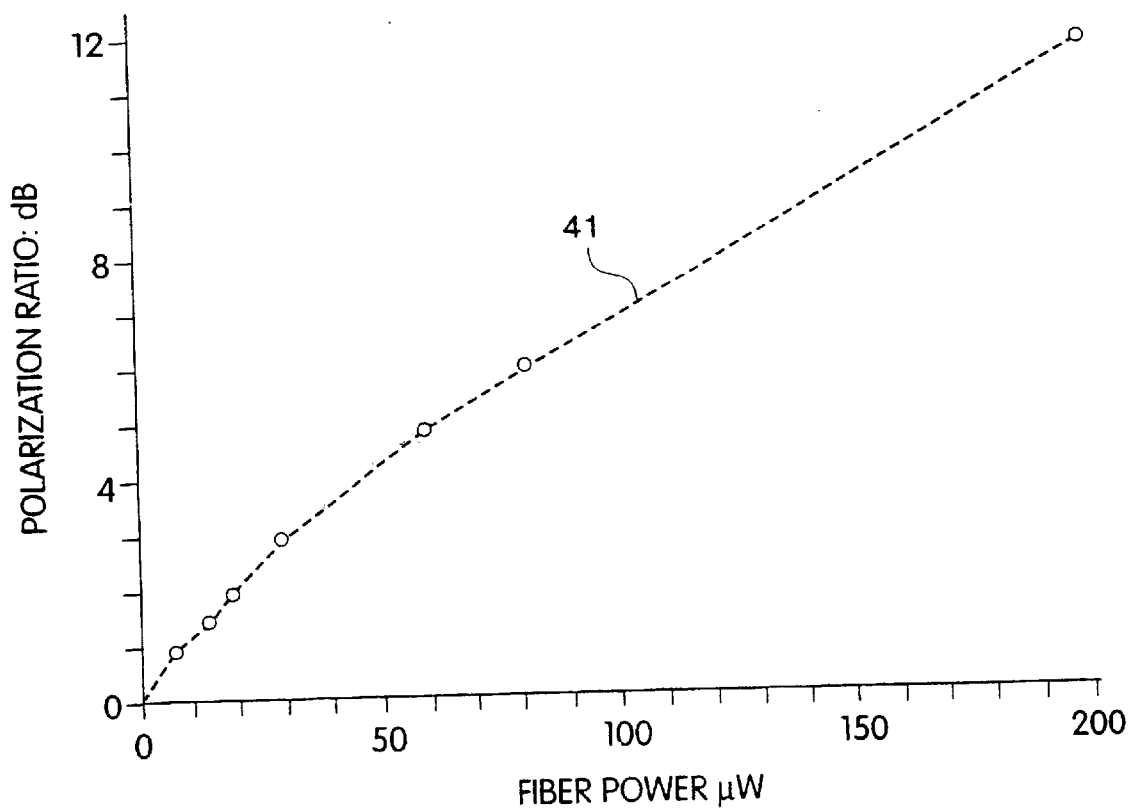
FIG. 4 shows the polarization ratio of the linewidth-broadened semiconductor light source as a function of the fiber-coupled optical power.

FIG. 4 shows the polarization ratio of the modified semiconductor light source as a function of the fiber-coupled optical power. Like the narrow spectral emission from a laser, the light coupled into the fiber is highly polarized, with the degree of the polarization increasing with optical power.

The semiconductor lasers having a broadened linewidth and produced by the method of the invention can be used with fiber optic gyros and fiber optic current sensors. The method can controllably convert an inexpensive laser into a superluminescent diode, which is significantly more expensive and difficult to obtain commercially. Coupling a 5 mW laser operating below threshold into a fiber produces less than 45 μW fiber-coupled power with a linewidth of 10 nm. The same 5 mW after discharging the coaxial capacitor described above couples more than 100 μW into the fiber at approximately the same linewidth.

The same process was applied to a laser with a higher optical output power, in this case a nominally 50 mW laser Model HL 7851G from Hitachi Corp. This type of laser is primarily used for writing information on a CD-ROM which requires a higher laser power than reading the information from the CD-ROM. In order to obtain the same broadening of the emission linewidth, the 50 mW laser required an electrical discharge from the transmission line with an approximately 10 times higher energy than the 5 mW laser discussed above. A total of six pulses were applied, producing a linewidth of Δλ=12 nm. The experimental results from the two exemplary lasers are summarized in Table 1.

| Length of Cable (m) | Applied Voltage (V) | Capacitance (pF) | Energy (μJ) | Peak Power (kW) | Pulse Duration (ns) | Observed Lasing/ Luminescence | Laser |
|---|---|---|---|---|---|---|---|
| 10 | 1000 | 990 | 495 | 11.8 | 100 | p-n junction destroyed, open circuit | RLD 78 PIT (nom. 5 mW) |
| 10 | 60 | 990 | 1.96 per pulse (*6 pulses) | 0.02 | 100 | Δλ = 12 nm | RLD 78 PIT (nom. 5 mW) |
| 10 | 190 | 990 | 19.6 per pulse (*6 pulses) | 0.2 | 100 | Δλ = 12 nm | HL 7851G (nom. 50 mW) |

While the invention has been disclosed with the preferred embodiments shown and described in detail, various modifications and improvements thereon will become readily apparent to those skilled in the art. For example, while the invention has been described using nominally 5 mW and 50 mW lasers emitting at 800 nm and employed, for example, in CD-ROM drives and laser printers, the technique described above is not restricted to a specific wavelength or nominal laser power level. The current pulse which is discharged across the laser terminals can also be produced by other sources which provide a controlled release of energy, for example, pulse generators and/or power supplies switched via fast FETs which are known in the art. Likewise, since facet damage may be responsible for the broadening of the laser linewidth, other methods of introducing controlled damage to the laser facet, such as heating of the facet with an external laser, may also be used.

I claim:

1. A method of controllably broadening a spectral characteristics of a semiconductor laser, comprising:
   a) providing an electric pulse having a predetermined pulse energy and predetermined pulse duration;
   b) discharging the electric pulse across electrical terminals of the semiconductor laser;
   c) monitoring the spectral characteristics of radiation emitted at a laser facet at a predetermined laser current; and
   d) repeating steps a) through c) until the spectral characteristics of the emitted radiation matches a predetermined spectral characteristics.

2. The method as in claim 1, wherein the predetermined laser current is selected so as to cause lasing of the semiconductor laser before the discharging the electric pulse through the semiconductor laser.

3. The method as in claim 1, wherein the predetermined spectral characteristics is a spectral linewidth selected to have a FWHM of greater than 1 nm.

4. The method as of claim 1, wherein the pulse duration is between 10 and 1000 ns.

5. The method as of claim 1, wherein the pulse duration is approximately 100 ns.

6. The method as of claim 1, wherein
   providing the electric pulse comprises providing a predetermined charge to a transmission line having two ends, the ends having respective electrical terminals; and
   discharging the electric pulse comprises connecting the electrical terminal disposed on one end of the transmission line to corresponding electrical terminals of the semiconductor laser, with the opposing end of the transmission line forming a reflector.

7. The method as in claim 6, wherein the transmission line is a coaxial cable.

8. The method as in claim 6, wherein the predetermined charge is provided by a power supply connected to the opposing end of the transmission line.

9. The method as in claim 8, wherein the power supply is connected to the opposing end of the transmission line via a resistor.

10. The method as in claim 9, wherein the resistor has a sufficiently high resistance to cause a voltage pulse traveling along a longitudinal direction of the transmission line to be reflected at the opposite end of the resistor.

11. The method as in claim 9, wherein the resistor is placed inside an outer jacket of the transmission line.

12. The method as of claim 8, wherein the coaxial cable has a length selected to provide a current pulse having the predetermined pulse duration.

13. A system for controllably broadening a spectral characteristics of a semiconductor laser, comprising:
   a transmission line having two ends and storing a predetermined charge, the ends having respective electrical terminals, with a first end forming a reflective circuit; and
   a connection which provides an electrical contact between electrical terminals of the semiconductor laser with the electrical terminals on the second end of the transmission line,
   wherein an electrical discharge pulse produced by the predetermined charge and passing through the semiconductor laser causes a broadening of the spectral characteristics of the radiation emitted by a facet of the semiconductor laser.

14. The system as in claim 13, wherein the transmission line is a coaxial cable.

15. The system as in claim 13, further including a power supply connectable to the transmission line via a resistor for providing the predetermined charge.

16. A method of producing a semiconductor light source suitable for use in a fiber-optic sensor having a predetermined birefringence, the method comprising:
   a) providing an electric pulse having a predetermined pulse energy and predetermined pulse duration;
   b) discharging the electric pulse across electrical terminals of the semiconductor laser;
   c) monitoring a spectral characteristics of radiation emitted at a laser facet at a predetermined laser current; and
   d) repeating steps a) through c) until the spectral characteristics of the semiconductor laser produces a de-coherence length which is smaller than the predetermined spacing in the fiber-optic sensor.

17. The method as in claim 16, wherein the predetermined spectral characteristics is a spectral linewidth selected to have a FWHM of greater than 1 nm.

18. The method of claim 16, wherein the predetermined spacing is determined by optical limitations in the fiber-optic sensor selected from the group consisting of fiber splices, fiber scattering centers and spacing between components of the fiber-optic sensor.

19. The method as of claim 16, wherein
   providing the electric pulse comprises providing a predetermined charge to a transmission line having two ends, the ends having respective electrical terminals; and
   discharging the electric pulse comprises connecting the electrical terminal disposed on one end of the transmission line to corresponding electrical terminals of the semiconductor laser, with the opposing end of the transmission line forming a reflector.

20. The method as in claim 19, wherein the transmission line is a coaxial cable.

21. The method as in claim 19, wherein the predetermined charge is provided by a power supply connected to the opposing end of the transmission line.

22. The method as in claim 21, wherein the power supply is connected to the opposing end of the transmission line via a resistor.

23. The method as in claim 22, wherein the resistor has a sufficiently high resistance to cause a voltage pulse traveling along a longitudinal direction of the transmission line to be reflected at the opposite end of the resistor.

24. The method as in claim 22, wherein the resistor is placed inside an outer jacket of the transmission line.

25. The method as claim 20, wherein the coaxial cable has a length selected to discharge the coaxial cable through the semiconductor laser by a current pulse having a pulse duration between 10 and 1000 ns.

26. The method as of claim 20, wherein the coaxial cable has a length selected to discharge the coaxial cable through the semiconductor laser by a current pulse having a pulse duration of approximately 100 ns.

27. The method as in claim 16, wherein the predetermined laser current is selected so as to cause lasing of the semiconductor laser before the discharging the electric pulse through the semiconductor laser.

* * * * *